(12) United States Patent
Chiao

(10) Patent No.: US 10,705,273 B2
(45) Date of Patent: Jul. 7, 2020

(54) MULTISPECTRAL INTERFERENCE COATING WITH DIAMOND-LIKE CARBON (DLC) FILM

(71) Applicant: RAYTHEON COMPANY, Waltham, MA (US)

(72) Inventor: Shu-Chung Chiao, Richardson, TX (US)

(73) Assignee: RAYTHEON COMPANY, Waltham, MA (US)

( * ) Notice: Subject to any disclaimer, the term of this patent is extended or adjusted under 35 U.S.C. 154(b) by 84 days.

(21) Appl. No.: 15/935,675

(22) Filed: Mar. 26, 2018

(65) Prior Publication Data

US 2019/0293850 A1 Sep. 26, 2019

(51) Int. Cl.
*G02B 5/28* (2006.01)
*C23C 16/505* (2006.01)
(Continued)

(52) U.S. Cl.
CPC .......... *G02B 5/281* (2013.01); *C23C 16/0227* (2013.01); *C23C 16/26* (2013.01);
(Continued)

(58) Field of Classification Search
CPC .......... G02B 5/28; G02B 5/281; G02B 5/285; G02B 5/286; G02B 5/287; G02B 5/288;
(Continued)

(56) References Cited

U.S. PATENT DOCUMENTS 4,995,684 A * 2/1991 Tustison ................. G02B 1/105
359/359
5,190,807 A * 3/1993 Kimock ................. C23C 16/006
428/216
(Continued)

FOREIGN PATENT DOCUMENTS

CN 101464528 A 6/2009
WO 9833948 A1 8/1998

OTHER PUBLICATIONS

Zhang et al. "Bias-graded deposition of diamond-like carbon for tribological applications", Diamond and Related Materials (2004) vol. 13, pp. 867-871.
(Continued)

*Primary Examiner* — Bao-Luan Q Le
(74) *Attorney, Agent, or Firm* — Lando & Anastasi, LLP

(57) ABSTRACT

Multispectral optical interference coatings and methods. In one example, an optical element includes a substrate having a first surface and a second surface disposed opposite the first surface, a first multi-layer dielectric film disposed on the first surface of the substrate and constructed and arranged to transmit light in a first band of wavelengths, a second multi-layer dielectric film disposed on the second surface of the substrate and constructed and arranged to transmit light in a second band of wavelengths, the first and the second bands of wavelengths at least partially overlapping, and a bilayer diamond-like carbon (DLC) coating disposed on the first multi-layer dielectric film, the bilayer DLC coating including a first layer and a second layer, the first layer
(Continued)

having a modulus of elasticity of a first value, and the second layer disposed on the first layer and having a modulus of elasticity of a second value that is greater than the first value.

20 Claims, 9 Drawing Sheets

(51) Int. Cl.
  *C23C 16/27* (2006.01)
  *G02B 5/26* (2006.01)
  *C23C 16/26* (2006.01)
  *C23C 16/02* (2006.01)
  *C23C 28/04* (2006.01)
  *C23C 16/455* (2006.01)
  *G02B 1/02* (2006.01)

(52) U.S. Cl.
  CPC ...... *C23C 16/272* (2013.01); *C23C 16/45523* (2013.01); *C23C 16/505* (2013.01); *C23C 28/046* (2013.01); *G02B 1/02* (2013.01); *G02B 5/26* (2013.01); *G02B 5/285* (2013.01)

(58) Field of Classification Search
  CPC .......... G02B 5/289; G02B 1/10; G02B 1/105; G02B 1/11; G02B 1/111; G02B 1/113; G02B 1/115; G02B 1/116; G02B 1/118; G02B 1/14
  See application file for complete search history.

(56) References Cited

U.S. PATENT DOCUMENTS

| | | | | |
|---|---|---|---|---|
| 5,470,661 A * | 11/1995 | Bailey | .................... | C23C 16/26 428/408 |
| 5,482,602 A | 1/1996 | Cooper et al. | | |
| 5,502,442 A * | 3/1996 | Sulzbach | ................ | C23C 14/18 342/2 |
| 6,228,471 B1 | 5/2001 | Neerinck et al. | | |
| 6,416,816 B2 * | 7/2002 | Veerasamy | ............ | B05D 5/083 427/162 |
| 9,057,887 B1 * | 6/2015 | Jaglan | .................... | G02C 7/107 |
| 9,335,444 B2 * | 5/2016 | Hart | ......................... | G02B 1/18 |
| 9,726,786 B2 * | 8/2017 | Hart | ......................... | G02B 1/18 |
| 10,114,233 B2 * | 10/2018 | Jaglan | ..................... | G02C 7/107 |
| 2008/0231957 A1 * | 9/2008 | Terayama | .............. | G02B 1/115 359/586 |
| 2008/0286541 A1 | 11/2008 | Zeisler et al. | | |
| 2009/0080077 A1 * | 3/2009 | Lin | ......................... | G02B 1/115 359/586 |
| 2009/0290219 A1 * | 11/2009 | Terayama | .............. | G02B 1/115 359/586 |
| 2014/0322502 A1 * | 10/2014 | Koyama | ................ | G02B 1/115 428/212 |
| 2015/0109663 A1 * | 4/2015 | Gittler | .................... | G02B 1/105 359/359 |
| 2015/0323705 A1 * | 11/2015 | Hart | ......................... | G02B 1/18 359/580 |
| 2016/0223717 A1 * | 8/2016 | Hart | ......................... | G02B 1/18 |
| 2017/0068114 A1 * | 3/2017 | Jaglan | .................... | G02C 7/107 |
| 2017/0336538 A1 * | 11/2017 | Hart | ......................... | G02B 1/18 |
| 2018/0011225 A1 * | 1/2018 | Bellman | ................. | G02B 5/28 |
| 2019/0023609 A1 * | 1/2019 | Yamaguchi | ......... | C03C 17/3441 |

OTHER PUBLICATIONS

Fu et al. "Laser micromachining of sputtered DLC films", Applied Surface Science (2006) vol. 252, pp. 4914-4918.

Li et al. "Multilayer DLC coatings via alternating bias during magnetron sputtering", Thin Solid Films (2011) vol. 519, pp. 4910-4916.

Ager, III et al. "Multilayer hard carbon films with low wear rates", Surface and Coatings Technology (1997) vol. 91, pp. 91-94.

Sun et al. "Properties and structures of diamond-like carbon film deposited using He, Ne, Ar/methane mixture by plasma enhanced chemical vapor deposition", Journal of Applied Physics (2000) vol. 87, No. 11, pp. 8122-8131.

Invitation to Pay Additional Fees in application No. PCT/US2019/023869 dated May 29, 2019.

* cited by examiner

MULTISPECTRAL INTERFERENCE COATING WITH DIAMOND-LIKE CARBON (DLC) FILM

GOVERNMENT LICENSE RIGHTS

This invention was made with Government support under W56HZV-17-C-0188, awarded by the United States of America Department of Defense. The Government has certain rights in this invention.

BACKGROUND

Diamond-like carbon (DLC) coatings typically comprise an amorphous combination of carbon and hydrogen that is capable of providing a durable protective coating for optical and other surfaces. However, adhesion between a single layer DLC coating and certain underlying materials is often a problem. In addition, the optical transmissivity of single layer DLC coatings is limited, which can limit their ability to be used in certain optical applications.

SUMMARY

Aspects and embodiments are directed to an optical element that is capable of multispectral transmission and includes a bilayer DLC coating that exhibits low internal stress characteristics.

According to one embodiment, an optical element comprises a substrate having a first surface and a second surface disposed opposite the first surface, a first multi-layer dielectric film disposed on the first surface of the substrate and constructed and arranged to transmit light in a first band of wavelengths, a second multi-layer dielectric film disposed on the second surface of the substrate and constructed and arranged to transmit light in a second band of wavelengths, the first and the second bands of wavelengths at least partially overlapping, and a bilayer diamond-like carbon (DLC) coating disposed on the first multi-layer dielectric film, the bilayer DLC coating including a first layer and a second layer, the first layer having a modulus of elasticity of a first value, and the second layer disposed on the first layer and having a modulus of elasticity of a second value that is greater than the first value.

In one example the optical element may include an adhesion layer disposed between the first multi-layer dielectric film and the bilayer DLC coating. According to some examples, the adhesion layer is one of silicon, germanium, and an oxide.

In one example at least one of the first multi-layer dielectric film and the second multi-layer dielectric film comprises one or more stacks of: a high index dielectric layer, a first medium index dielectric layer disposed over and contacting the high index layer, a low index dielectric layer disposed over and contacting the first medium index layer, and a second medium dielectric index layer disposed over and contacting the low index layer, wherein the high index dielectric layer has an index of refraction that is greater than the first medium index dielectric layer, the second medium dielectric layer, and the low index dielectric layer, and the indices of refraction of the first and second medium index dielectric layers are greater than the index of refraction of the low index dielectric layer.

In one example the bilayer DLC coating is a first bilayer DLC coating and the optical element further comprises a second bilayer DLC coating disposed on the first bilayer DLC coating. According to other examples, the optical element further comprises at least one additional bilayer DLC coating disposed on the second bilayer DLC coating.

According to one example the first and the second bands of wavelengths are configured to transmit visible (VIS) light having wavelengths of from 0.4 to 0.75 microns and at least one of near-infrared (NIR) light having wavelengths of from 0.75 to 1.4 microns, short-wavelength infrared (SWIR) light having wavelengths of approximately 1.4-3 microns, mid-wavelength infrared (MWIR) light having wavelengths of approximately 3-8 microns, long-wavelength infrared (LWIR) light having wavelengths of approximately 8-15 microns, and far-infrared (FIR) light having wavelengths of approximately 15-1000 microns. In some examples the substrate is configured to transmit VIS and the at least one of NIR, SWIR, MWIR, LWIR, and FIR light.

According to another example the first and the second bands of wavelengths are configured to transmit mid-wavelength infrared (MWIR) light having wavelengths of from 3 to 8 microns and long-wavelength infrared (LWIR) light having wavelengths of from 8 to 15 microns. In some examples, the substrate is configured to transmit MWIR and LWIR light.

According to some examples the first layer of the DLC coating has an sp3/sp2 ratio with a first value, and the second layer of the DLC coating has an sp3/sp2 ratio with a second value that is higher than the first value.

In one example the second layer of the DLC coating consists of sp3 bonded carbon. In another example the first layer of the DLC coating comprises a mixture of sp3 and sp2 bonded carbon.

In some examples the bilayer DLC coating has a thickness of at least 500 nm.

According to another embodiment a method of forming an optical element comprises providing a substrate having a first surface and a second surface disposed opposite the first surface, depositing a first multi-layer dielectric film on the first surface of the substrate such that the first multi-layer dielectric film transmits light having a first band of wavelengths, depositing a second multi-layer dielectric film on the second surface of the substrate such that the second multi-layer dielectric film transmits light having a second band of wavelengths, the first and the second bands of wavelengths at least partially overlapping, forming a first layer of a DLC coating on the first multi-layer dielectric film having a modulus of elasticity of a first value, and forming a second layer of DLC coating on the first layer of DLC coating having a modulus of elasticity of a second value that is greater than the first value.

In one example forming the first and the second layers of the DLC coating includes plasma enhanced chemical vapor deposition (PECVD). In another example PECVD for the second layer of the DLC coating includes a plasma consisting of a hydrocarbon. In some examples PECVD for the first layer of the DLC coating includes a plasma consisting of a mixture of a hydrocarbon and an inert gas. In one example the mixture is at least 50% inert gas.

In one example the first and the second bands of wavelengths are configured to transmit visible (VIS) light having wavelengths of from 0.4 to 0.75 microns and at least one of near-infrared (NIR) light having wavelengths of from 0.75 to 1.4 microns, short-wavelength infrared (SWIR) light having wavelengths of approximately 1.4-3 microns, mid-wavelength infrared (MWIR) light having wavelengths of approximately 3-8 microns, long-wavelength infrared (LWIR) light having wavelengths of approximately 8-15 microns, and far-infrared (FIR) light having wavelengths of approximately 15-1000 microns.

Still other aspects, embodiments, and advantages of these example aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Embodiments disclosed herein may be combined with other embodiments, and references to "an embodiment," "an example," "some embodiments," "some examples," "an alternate embodiment," "various embodiments," "one embodiment," "at least one embodiment," "this and other embodiments," "certain embodiments," or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
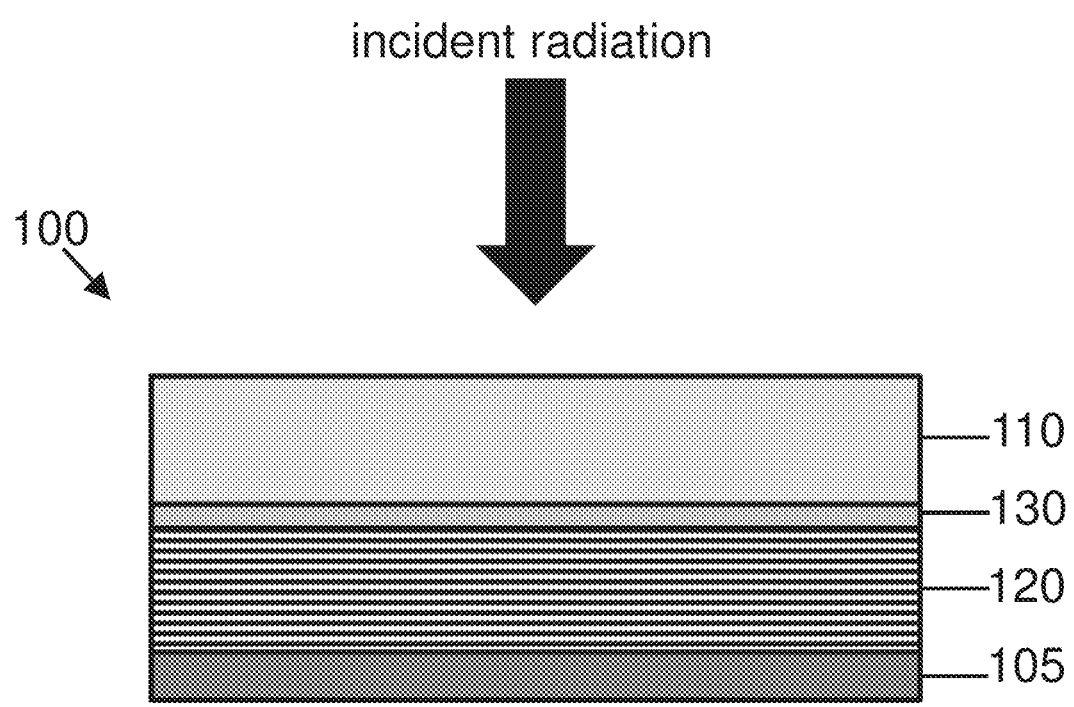
FIG. 1 is a schematic diagram showing one example of an optical element in accordance with one or more aspects of the invention.

Diamond-like carbon (DLC) coatings exhibit many desirable properties, including high elastic modulus and hardness values, high wear resistance, low friction coefficients, chemical inertness, and biocompatibility. The unique combination of these types of properties makes these coatings attractive for many applications. In terms of optical applications, the DLC coating is transparent within the infrared spectral region, and has an index of refraction of about 2.0. For certain applications, this latter property makes the DLC coating a suitable match to high index materials such as silicon (n=3.426 @ 4.0 µm) and germanium (n=4.026 @ 4.0 µm), and the DLC coating also adheres well to these materials. DLC coatings are commonly used as a single layer anti-reflective coating (ARC) and as a protective coating for infrared optics. However, the spectral bandwidth of a single layer DLC coating is limited since its index of refraction only matches that of the substrate at one wavelength. This makes the single layer DLC coating unsuitable for thermal imaging applications that operate in either single or dual bands of wavelengths.

Diamond-like carbon (DLC) typically contains a significant fraction of sp3 bonds, and single layer DLC coatings that have a high sp3 content also exhibit higher hardness values, but also have high internal stress. Increasing the sp2 content lowers the internal stress, but also decreases the hardness values, which reduces the protective value of the DLC coating. It is therefore difficult to prepare a single layer DLC coating that exhibits both high hardness and low compressive stress properties.

As described in further detail below, an optical element having multispectral transmission is disclosed that is also characterized by low internal stress and high durability. Spectral transmission can be increased by pairing the DLC coating with a multi-layer dielectric film, and internal stress can be reduced by using a bilayer approach such that one layer has a higher modulus of elasticity than the other layer.

The aspects disclosed herein in accordance with the present invention, are not limited in their application to the details of construction and the arrangement of components set forth in the following description or illustrated in the accompanying drawings. These aspects are capable of assuming other embodiments and of being practiced or of being carried out in various ways. Examples of specific implementations are provided herein for illustrative purposes only and are not intended to be limiting. In particular, acts, components, elements, and features discussed in connection with any one or more embodiments are not intended to be excluded from a similar role in any other embodiments.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls. Moreover, titles or subtitles may be used in the specification for the convenience of a reader, which shall have no influence on the scope of the present invention.

Referring to FIG. 1, there is illustrated a schematic representation of one example of an optical element, generally referred to at 100, according to one embodiment. The optical element 100 may be configured as any one of a window, lens, prism, filter, etc., that can be used in an optical application, such as in an imaging sensor or other optical device. The optical element includes a substrate 105, a multi-layer dielectric (MLD) film 120 disposed on the substrate 105, an adhesion layer 130 disposed on the MLD film 120, and a DLC coating 110 disposed on the adhesion layer 130. In certain instances, the adhesion layer 130 may be the top or outermost layer of the MLD film 120 (from the substrate 105), and therefore a separate adhesion layer is not necessary.

DLC Coating

Diamond-like carbon (DLC) typically contains a significant fraction of sp3 bonds and can include amorphous carbon (a-C) and hydrogenated carbon (a-C:H). Carbon has three hybridizations: sp3, sp2, and sp1, with sp3 being the configuration present in diamonds (and can be referred to as diamond bonding), and sp2 being the configuration present in graphite (and can be referred to as graphite bonding). For example, in diamond, all carbon atoms are fully sp3 bonded, and graphite contains pure sp2 bonding. Certain properties of the DLC coating are determined by the amount of diamond bonding (sp3) compared to graphite bonding (sp2) of the carbon (also called the sp3/sp2 ratio), and in certain instances the content of sp3 or sp2 bonding can be controlled, as discussed in further detail below, by the deposition settings and/or materials used when forming the DLC coating.

As mentioned above, DLC coatings with a high sp3 content have high internal stress, making it difficult for these films to adhere to underlying materials. This high compressive stress can cause the DLC coatings to delaminate, especially in thicker films. According to one embodiment, this problem can be alleviated by using a bilayer approach, where a first layer has a higher modulus of elasticity than the second layer. The layer with the higher modulus of elasticity can be used as the "outer" layer that is exposed to the external environment and incident radiation, as exemplified in FIG. 1.

Figure 2A:
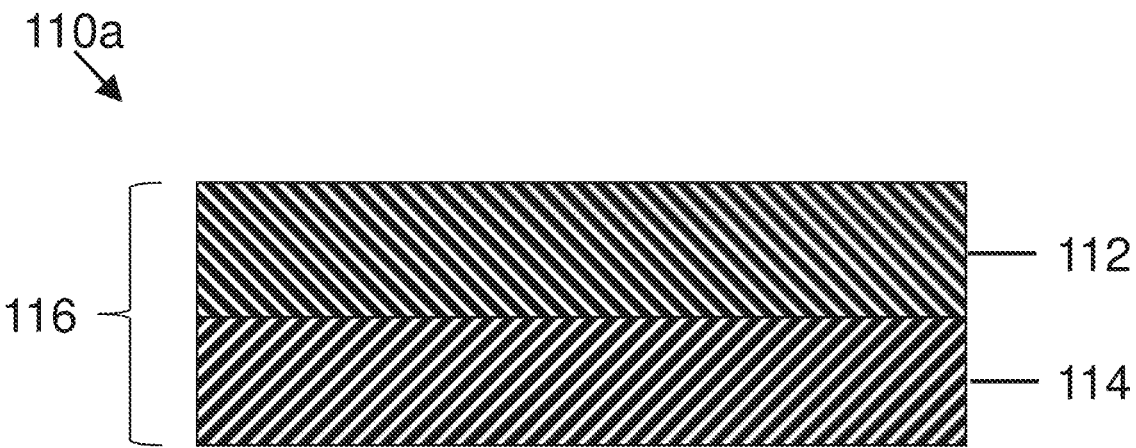
FIG. 2A is a schematic diagram showing one example of a DLC coating in accordance with one or more aspects of the invention.

An example of a DLC coating 110a comprising one bilayer 116 is shown in FIG. 2A. The first DLC layer 112 has a higher modulus of elasticity and a higher sp3 content (and exhibits more diamond-like behavior, i.e., is harder) than a second DLC layer 114 that has a lower modulus of elasticity and a lower sp3 content (and a higher sp2 content than the first DLC layer 112) (and exhibits more graphite-like behavior, i.e., is softer). An sp3/sp2 ratio of the second DLC layer 114 is lower than the sp3/sp2 ratio of the first DLC layer 112. The first DLC layer 112 is disposed over and contacts the second DLC layer 114. In this example, the first DLC layer 112 with the higher modulus of elasticity is disposed outward from the second DLC layer 114, such that the first DLC layer 112 is exposed to the external environment and incident radiation. The lower modulus of elasticity of the second DLC layer 114 functions to alleviate internal stress, and aids in allowing the DLC layer 110a to adhere more readily to underlying materials.

According to some embodiments, the first DLC layer 112 may have a modulus of elasticity (i.e., Young's modulus) having a first value, and the second DLC layer 114 may have a modulus of elasticity having a second value, where the difference between the first and the second value is at least 10 GPa. The difference between the first and the second value may be dependent on the application, and difference values of greater than 10 GPa and less than 10 GPa are also within the scope of this disclosure.

In one embodiment, the first DLC layer 112 may consist of sp3 bonded carbon atoms. According to another embodiment, the first DLC layer 112 may consist of hydrogenated carbon (a-C:H). According to some embodiments, the first DLC layer 112 may consist of non-hydrogenated tetrahedral amorphous carbon (ta-C). In other embodiments, the first DLC layer 112 may consist of hydrogenated tetrahedral carbon (ta-C:H). In yet other embodiments, the first DLC layer 112 has at least 40% sp3 bonded carbon, at least 50% sp3 bonded carbon, at least 60% sp3 bonded carbon, at least 70% sp3 bonded carbon, at least 80% sp3 bonded carbon, or at least 90% sp3 bonded carbon. In accordance with certain embodiments, the remaining percentage is at least one of hydrogen and sp2 bonded carbon.

In one embodiment, the second DLC layer 114 has a higher fraction (or percentage) of sp2 bonds than the first DLC layer 112. In certain embodiments, the fraction of sp3 bonded carbon in the second DLC layer 114 is lower than 40% (with the remaining percentage being at least one of sp2 bonded carbon and hydrogen). According to at least one embodiment, the fraction of sp2 bonded carbon in the second DLC layer 114 is greater than 50% (with the remaining percentage being at least one of sp3 bonded carbon and hydrogen). In some embodiments, the second DLC layer 114 may consist of amorphous carbon (a-C), which in some instances can include amorphous hydrogenated carbon (a-C:H). According to certain embodiments, the second DLC layer 114 may include a mixture of sp3 and sp2 bonded carbon.

Figure 2B:
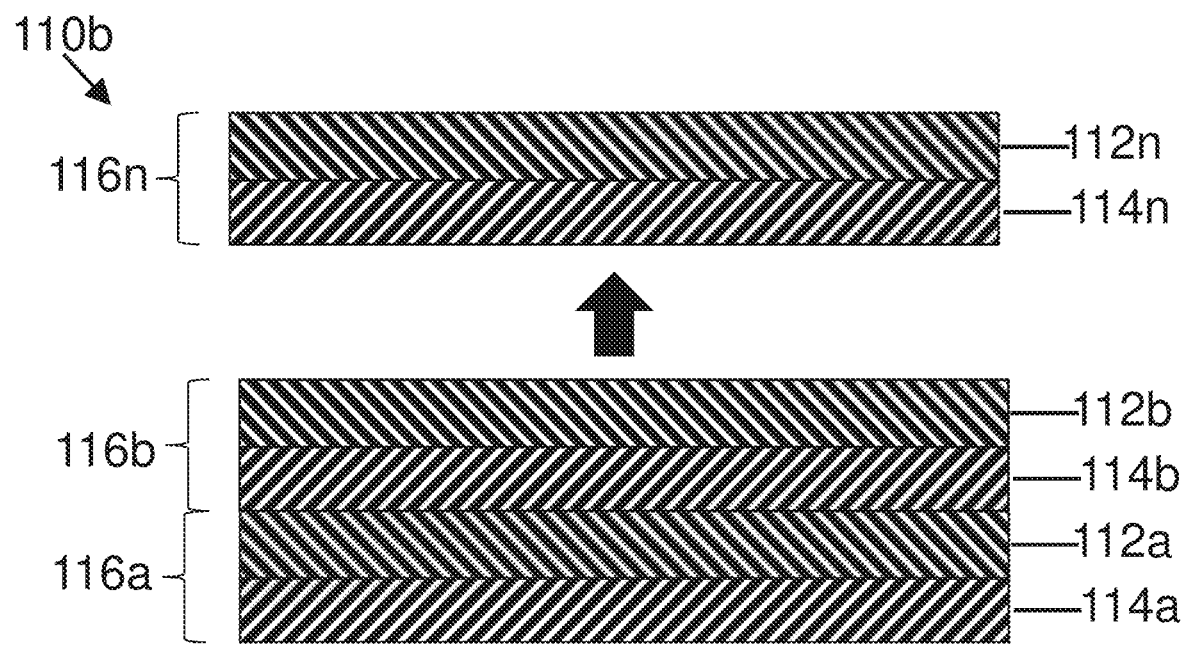
FIG. 2B is a schematic diagram showing another example of a DLC coating in accordance with one or more aspects of the invention.

Another example of a DLC coating 110b comprising two or more bilayers is shown in FIG. 2B. A first bilayer 116a consisting of a first DLC layer 112a and a second DLC layer 114a may be deposited first, and a second bilayer 116b consisting of a first DLC layer 112b and a second DLC layer 114b may be deposited on the first bilayer 116a such that the second DLC layer 114b of the second bilayer 116b is disposed over and contacts the first DLC layer 112a of the first bilayer 116a. The first and second bilayers 116a and 116b may include DLC layers having the same composition. For example, DLC layers 112a and 112b may be identical or substantially similar in composition, and DLC layers 114a and 114b may be identical or substantially similar in composition. In other embodiments, the bilayers may include DLC layers having different compositions. For example, one bilayer may have first and second DLC layers with first and second compositions (e.g., sp3 and/or sp2 content) and a second bilayer may have first and second DLC layers with respective compositions where at least one of the first and second DLC layers of the second bilayer has a composition that is different than the corresponding DLC layer in the first bilayer. In some embodiments, a "graded" deposition profile (e.g., gradual increase or decrease of an sp3 concentration in one of the DLC layers of the bilayer as successive bilayers is deposited) can be implemented in the coating by using bilayers that include DLC layers having different compositions from DLC layers of other bilayers in the coating.

As indicated in FIG. 2B, according to some embodiments, an "n" total number of bilayers 116n (where "n" is one or more) may be used in the DLC coating 110. The number of bilayers may depend on the application. For instance, the number of "n" bilayers may influence the residual stress, hardness, and adhesion strength of the DLC coating 110.

Returning to FIG. 1, in some embodiments, the total thickness of the DLC coating 110 (including one or more bilayers 116) may be at least 300 nm, and in some embodiments is at least 500 nm. In accordance with one embodiment, the total thickness of the DLC coating 110 is about 500 nm. According to one embodiment, the DLC coating 110 may have a maximum thickness of about one micron, although values greater than one micron are within the scope of this disclosure. The thickness of each bilayer 116 and each layer (112, 114) in the bilayer may depend on the application. For example, the thickness of the bilayer 116 influences the mechanical properties of the DLC coating 110, such as hardness and strength. In one embodiment, the total thickness of the DLC coating 110 is about 500 nm, and consists of one bilayer 116, where each of the DLC layers 112 and 114 have a thickness of 250 nm. In another embodiment, the total thickness of the DLC coating is about 500 nm, and consists of two bilayers 116, where each bilayer has a thickness of 250 nm, and each of the DLC layers 112 and 114 have a thickness of 125 nm. According to various embodiments, the DLC layers may be at least 10 nm in thickness.

Figure 5:
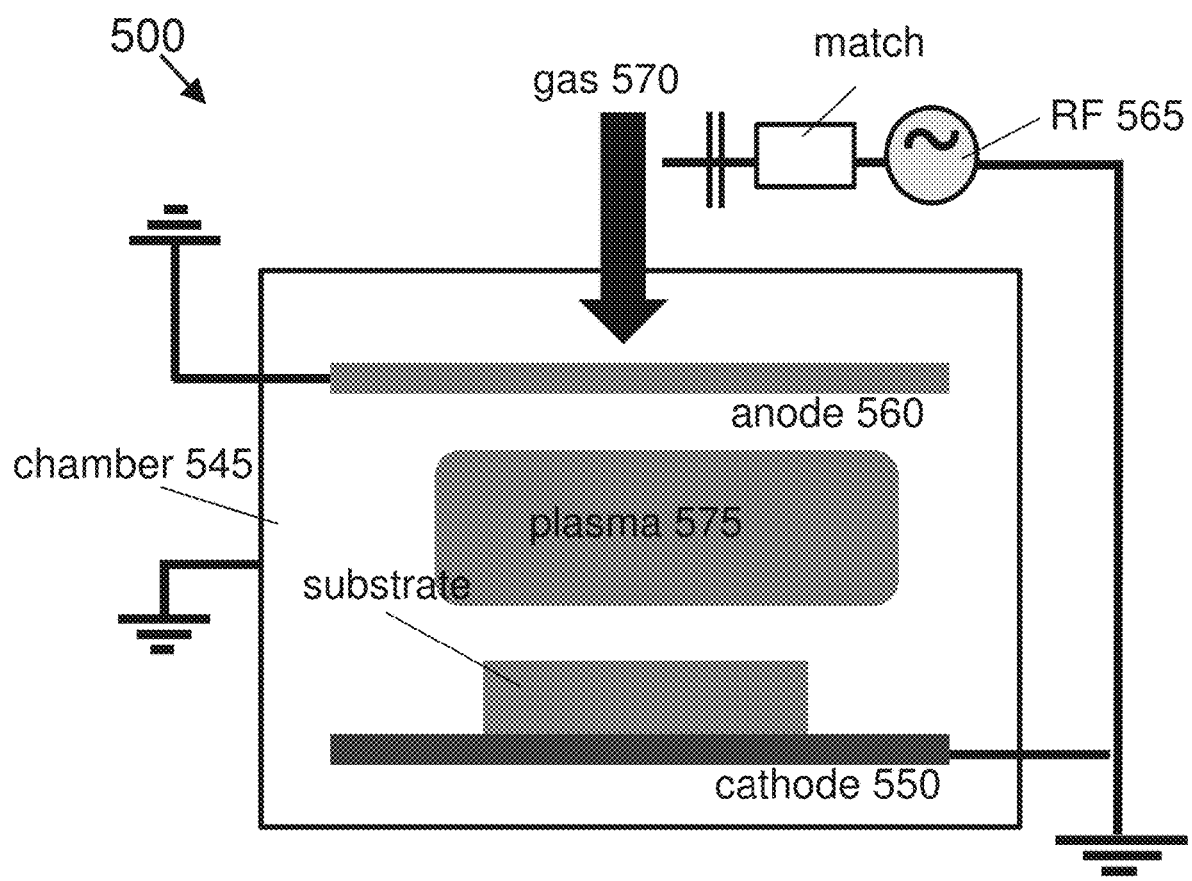
FIG. 5 is a schematic representation of one example of an apparatus that may be used for depositing DLC coatings in accordance with one or more aspects of the invention.

DLC coatings can be formed using any one of a number of thin film deposition methods, including chemical vapor deposition (CVD) techniques such as plasma enhanced chemical vapor deposition (PE-CVD) processes. A deposition plasma comprising a carbon containing gas may be used. One example of a PE-CVD method that may be used for forming DLC coatings in accordance with at least one embodiment is radio frequency plasma enhanced chemical vapor deposition (RF-PECVD). An example of an RF-PECVD reactor apparatus is shown generally at 500 in FIG. 5. The reactor 500 typically includes a vacuum chamber 545 where a substrate is placed. A cathode 550 and an anode 560 are also disposed in the vacuum chamber 545, where deposition gas 570 is introduced. An RF power supply 565 generates RF potential that is applied to the deposition gas 570 to generate plasma 575. Electrons in the plasma ionize or dissociate reactant gases to generate radicals, which form the layer of deposition material on the sample. According to one embodiment, the deposition is performed at room temperature.

According to one embodiment, the deposition gas 570 comprises a carbon containing gas, and in certain embodiments is a hydrocarbon. Non-limiting examples of suitable hydrocarbons for use in forming the DLC coatings described herein include alkanes, such as methane, alkenes, such as ethylene, and alkynes, such as acetylene. Aromatic hydrocarbons, such as benzene, may also be used. In at least one embodiment, the first DLC layer 112 is formed from a deposition gas 570 that consists of a hydrocarbon. According to other embodiments, the deposition gas 570 comprises a mixture of a carbon containing gas and an inert gas. Examples of inert gases that may be used in forming the DLC coatings include helium, neon, argon, krypton, xenon, and nitrogen. As discussed in the Examples below, increasing the amount of inert gas in the mixture (or reducing the amount of hydrocarbon gas in the mixture) reduces the modulus of elasticity or hardness of the resulting DLC layer. In some embodiments, the second DLC layer 114 is formed from a deposition gas 570 that comprises a mixture of a hydrocarbon and an inert gas. In at least one embodiment, the deposition gas 570 used for forming the second DLC layer 114 includes at least 50% of an inert gas.

Deposition parameters such as the hydrocarbon content in the gas mixture and the deposition time (for thickness) for each DLC layer included in the bilayer can be adjusted for a specific application. For instance, desired mechanical properties, such as a desired hardness (e.g., based on military or industrial standards) for the DLC layer exposed to the external environment can be achieved by controlling the hydrocarbon content and/or thickness of the DLC layer.

Multi-Layer Dielectric (MLD) Film

Returning to FIG. 1, in some embodiments, one or more multi-layer dielectric (MLD) films 120 may be deposited on the substrate 105 for purposes of providing dual-band or multispectral spectral transmission. As noted above, the transmission properties of the DLC coating 110 can be limited, and in some instances are limited to only a certain region of the IR spectrum. Furthermore, DLC films have high absorption in the visible and near-infrared regions. In addition, the thicker the DLC film, the higher the absorption (but reducing thickness will reduce the durability). Combining the DLC coating 110 with one or more MLD films 120 allows for dual-band or multispectral functionality (e.g., a multispectral interference coating) of the optical element 100. Dual-band imaging typically includes using two distinct bands of wavelengths within the electromagnetic spectrum, whereas multispectral typically refers to two or more bands or ranges of wavelengths. In certain instances the bands of wavelengths correspond to regions of the electromagnetic spectrum, such as the visible (VIS) region having wavelengths of approximately 400-750 nm, the near-infrared (NIR) region having wavelengths of approximately 750-1400 nm, the short-wavelength infrared (SWIR) region having wavelengths of approximately 1.4-3 microns, the mid-wavelength infrared (MWIR) region having wavelengths of approximately 3-8 microns, the long-wavelength infrared (LWIR) region having wavelengths of approximately 8-15 microns, and the far-infrared (FIR) region having wavelengths of approximately 15-1000 microns.

The MLD film 120 may include a plurality of layers, and the MLD film 120 may be formed from two or more materials having different refractive indices. The two or more materials may be substantially transparent at one or more bands of wavelengths. In some embodiments, the individual layers of the MLD film 120 may be formed from dielectric materials. As used herein, the term "dielectric material" broadly refers to a material that is an electrical insulator or poor conductor of electric current; although according to some embodiments the MLD film 120 may include one or more layers that are typically characterized as semiconductors, such as germanium or silicon.

The materials chosen for a particular MLD film 120 may be based on several factors, including the ability to transmit certain desired wavelengths of electromagnetic radiation, as discussed further below. In some instances, the materials used in the MLD film 120 are transparent in the wavelength range of the particular application, such as a sensor. Non-limiting examples of materials that may be used in the MLD film 120 include oxides, sulfides, and selenides, such as titanium oxide, magnesium oxide, zinc oxide, silicon oxide, silicon dioxide (silica), aluminum oxide, indium sulfide, indium selenide, tin oxide, zinc sulfide, and zinc selenide. Other non-limiting examples of materials that may be used in the MLD film 120 include fluorides, such as magnesium fluoride, yttrium fluoride, as well as silicon and germanium. The materials used in the MLD film 120 may be inorganic. Depending on the application, two or more dielectric materials may be used in the MLD film 120. The materials used in the MLD film 120 may be deposited onto the substrate 105 using any one of a number of thin film vacuum deposition techniques, including chemical and physical vapor deposition methods. For example, one or more layers of the MLD film 120 may be deposited using ion beam assisted deposition methods. According to one embodiment, the ion gun may be of the Kaufman type in which ions are formed in crossed electrical and magnetic fields.

In some embodiments, the MLD film 120 includes multiple layers of high, medium, and low refractive index dielectric materials. The thicknesses of the layers of material included in the MLD film 120 may also vary, as discussed further below. A particular configuration for the MLD film 120 may depend on several factors, including the wavelengths of interest, the thicknesses of the layers, and the variation of the index of refraction of the layers.

According to some embodiments, the MLD film 120 includes alternating layers of high and low refractive index materials, and in other embodiments, the MLD film 120 includes alternating layers of high, medium, and low refractive index materials. The high, medium, and low refractive index comparison can be made at any one of a number of different reference wavelengths, and according to at least one embodiment, the reference wavelength is 550 nm. The high index material has an index of refraction that is greater than the medium index material, and the medium index material has an index of refraction that is greater than the low index material. As used herein, a high index material may have an index of refraction of at least about 2.0 at 550 nm, a medium index material may have an index of refraction between about 1.7 and about 2.0 at 550 nm, and a low index material may have an index of refraction of less than about 1.7 at 550 nm.

Figure 3:
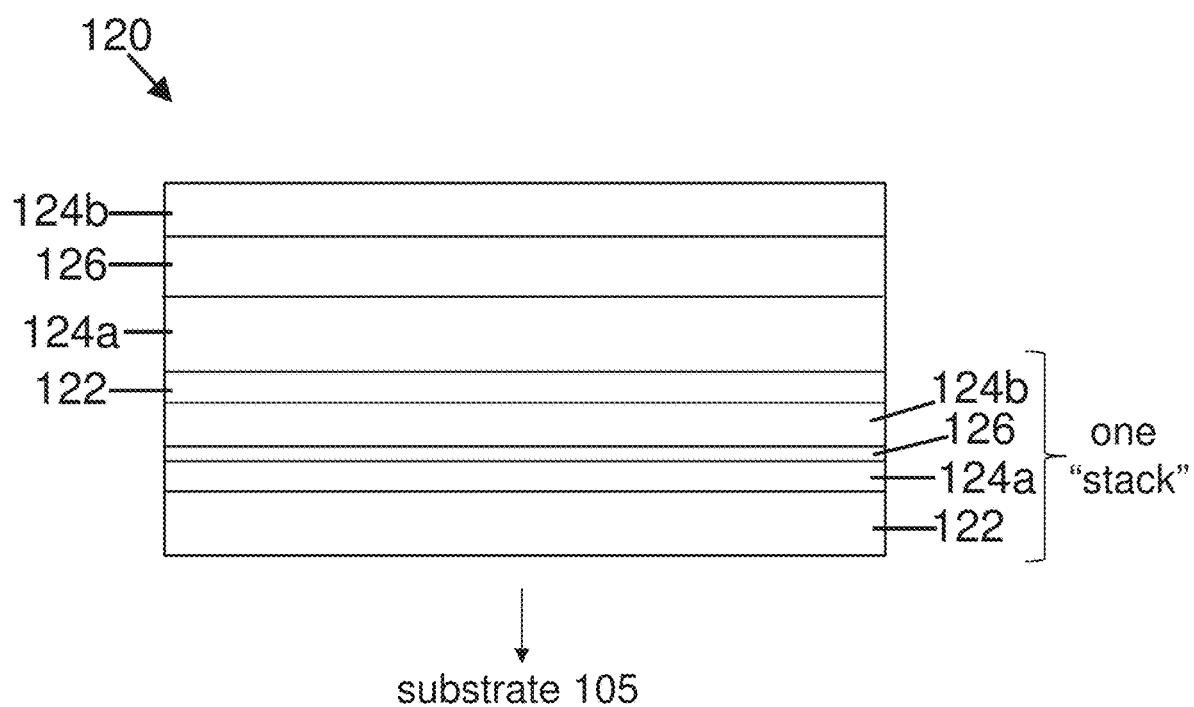
FIG. 3 is a schematic diagram showing one example of a multi-layer dielectric (MLD) film in accordance with one or more aspects of the invention.

One non-limiting example of an MLD film 120 is shown in FIG. 3. The MLD film 120 includes multiple layers of material that are arranged in a repeating stack (which may also be referred to herein as a "period"). Each stack includes a high index material 122, a first medium index material 124a disposed over and contacting the high index material 122, a low index material 126 disposed over and contacting the first medium index material 124a, and a second medium index material 124b disposed over and contacting the low index material 126. In this example, the high index material 122 of the first stack is positioned either on or closest to the substrate 105. According to one embodiment, the first medium index material 124a and the second medium index material 124b are the same material, but they may each have different thickness values. In other embodiments, the first and second medium index materials 124a and 124b are different medium index materials.

The example MLD film 120 shown in FIG. 3 includes two repeating "stacks" of high index, first medium index, low index, and second medium index materials, but it is to be appreciated that one or more than two "stacks" may be included in the MLD film 120. The "stack" may be "repeating" in that materials having high, medium, or low indices of refraction may be used in the same order in the stack, but each stack may have layers with different thicknesses than the corresponding layers in another stack. The number of repeating stacks may depend on the application and/or design criteria, such as the desired transmission bands, the overall minimum or maximum thickness, size constraints of the resulting device, durability requirements, and other considerations, such as a desired curvature, asphericity, minimum transmittance values, maximum reflectance values, etc.

The example MLD film 120 shown in FIG. 3 includes a repeating stack of high, medium, low, and medium index materials, but other embodiments may include other types of repeating "stacks." For instance, the MLD film 120 may include a repeating stack of high index and low index materials such that the MLD film 120 comprises alternating layers of high and low index materials. In some embodiments, a refractive index difference between a pair of layers adjacent to one another in the MLD film 120 is at least about 0.50. In other embodiments, the refractive index difference is at least about 0.10. In some embodiments, the refractive index difference is at least about 0.05. In other embodiments, the MLD film 120 may include a repeating stack of high index and medium index materials, or medium index and low index materials. In some embodiments there is no repeating stack, but adjacent layers in the stack have different indices of refraction.

The layers of the materials that comprise the MLD film 120 may also have different thicknesses. Referring again to the example of the MLD film 120 shown in FIG. 3, each of the high index 122, medium index 124a and 124b, and low index 126 material layers has a different thickness. In some embodiments, each layer in the MLD film 120 has a different thickness, but in other embodiments, the MLD film 120 includes two or more layers having the same thickness value. According to at least one embodiment, each layer of material included in the MLD film 120 may be characterized as being "thin," meaning that the thickness does not exceed about two microns.

In some embodiments, the MLD film 120 includes one or more "stacks" of a high, low, and/or medium index material(s), and may also include one or more other separate layers that are disposed on (i.e., adjacent) and contact the "top" and/or "bottom" layer of the "stack." These separate layer(s) have an index of refraction that is different than the index of refraction of the respective "top" and/or "bottom" layer of the MLD stack. For instance, using FIG. 3 as an example, an additional low index material 126 or high index material 122 may be positioned on top of the "top" medium index material 124b. The presence or absence of one or more of these types of separate layers depends on the configuration of the MLD film 120, including the configured transmission properties.

The MLD film 120 may be configured to be substantially or completely transmissive to one or more bands of wavelengths of electromagnetic radiation. For instance, in some embodiments, the MLD film 120 is configured to transmit at least 90% of the waveband of interest (i.e., incoming radiation). According to one embodiment, the MLD film 120 is configured to be transmissive to at least two regions of the IR, e.g., LWIR and MWIR. According to another embodiment, the MLD film 120 is configured to be transmissive to both the VIS spectral range and at least one of the IR (e.g., NIR, SWIR, MWIR, LWIR, FIR) spectral regions.

Figure 4:
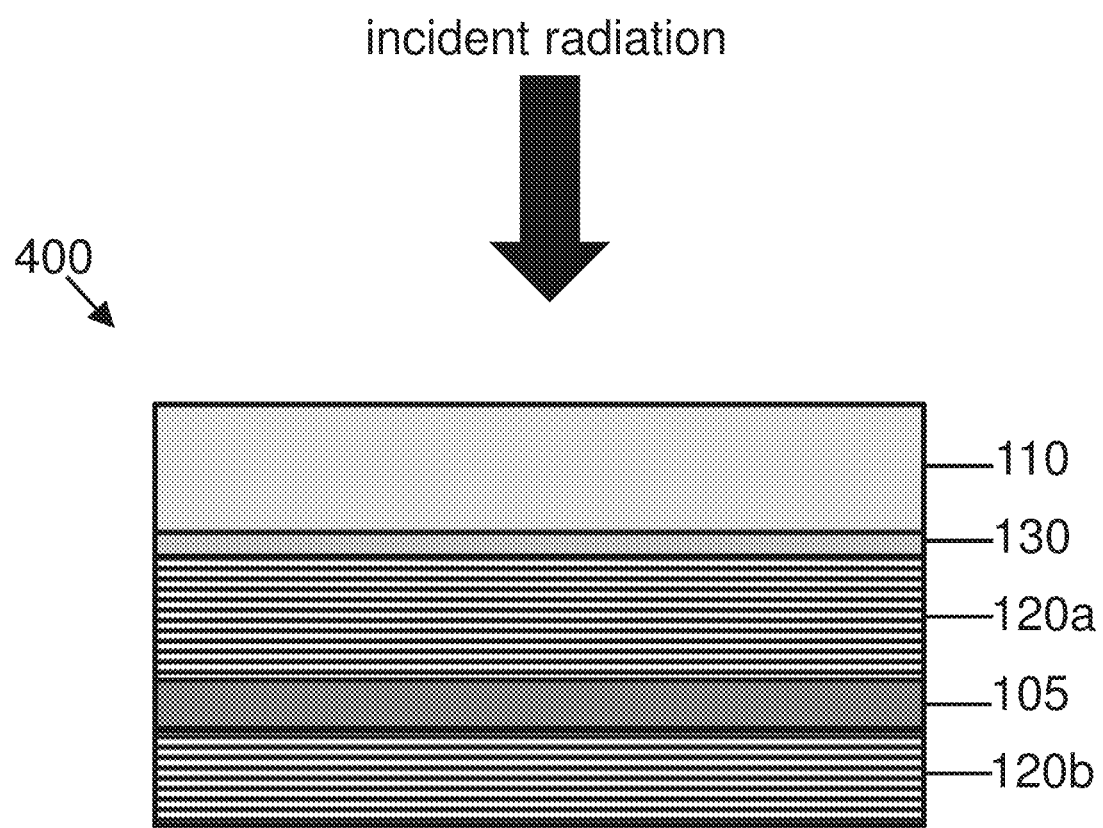
FIG. 4 is a schematic diagram showing another example of an optical element in accordance with one or more aspects of the invention.

Referring now to FIG. 4, according to some embodiments, an optical element 400 may include a first MLD film 120a disposed on one side or surface of the substrate 105, and a second MLD film 120b disposed on the opposite side of the substrate 105. The first MLD film 120a is configured to transmit light having a first band of wavelengths, and the second MLD film 120b is configured to transmit light having a second band of wavelengths, a second multi-layer dielectric film disposed on the second surface of the substrate and constructed and arranged to transmit light in a second band of wavelengths, wherein the first and the second bands of wavelengths at least partially overlap. For instance, the first MLD film 120a may be configured to transmit light in a first region of the electromagnetic spectrum, and the second MLD film 120b may be configured to transmit light in a second region that at least partially overlaps with the first region. According to one embodiment, the first MLD film 120a may be configured as a long wave pass filter and the second MLD film 120b may be configured as a short wave pass filter. According to another embodiment, the first MLD film 120a may be configured as a short wave pass filter and the second MLD film 120b may be configured as a long wave pass filter. Since light is only transmitted for wavelengths where the first and second MLD films overlap, the combination of the first and second MLD films may function as a band pass filter for the optical element 400.

In one embodiment, the first and second MLD films 120a and 120b are configured to work in combination to transmit light in different regions of the IR spectrum, such as the MWIR and the LWIR. For example, the first MLD film 120a may be configured to transmit light in a first band or bands of wavelengths, and the second MLD film 120b may be configured to transmit light in a second band or bands of wavelengths, such that MWIR and LWIR bands of wavelengths are transmitted (through 120b). In other embodiments, the first MLD film 120a may be configured to transmit light in a first band or bands of wavelengths and the second MLD film 120b may be configured to transmit light in a second band or bands of wavelengths, such that LWIR and MWIR band of wavelengths are transmitted. In another embodiment, the first and second MLD films 120a and 120b are configured to transmit light in the VIS band of wavelengths and one of the IR regions of the electromagnetic spectrum, such as the NIR, FIR, LWIR, MWIR, or SWIR bands of wavelengths.

According to some embodiments, the MLD film 120 may be configured to transmit a band of wavelengths within a spectral region, such as MWIR, VIS, NIR, etc. In some instances the band of wavelengths may be 20-100 nm wide, but it is to be appreciated that wider or narrower bands are within the scope of this disclosure. In reference to FIG. 4, according to certain embodiments, the first MLD film 120a and the second MLD film 120b may be configured to transmit a band of wavelengths within two or more different spectral regions.

According to alternative embodiments, the first MLD film 120a is configured to transmit light having a first band of wavelengths, and the second MLD film 120b is configured to transmit light having a second band of wavelengths that is different than the first band of wavelengths. For instance, the first MLD film 120a may be configured to transmit light in one region of the electromagnetic spectrum, and the second MLD film 120b may be configured to transmit light in another, different region of the electromagnetic spectrum.

The configuration of the MLD film 120 may be implemented using software that utilizes a particular optical prescription set by a user that includes design objectives and constraints. The software then uses one or more algorithms to determine the physical configuration for the MLD film 120 based on the design criteria, which can then be implemented using thin film deposition processes. The MLD film 120 may be designed, characterized, and optimized using commercially available software tools including FILM-STAR™ from FTG Software Associates, OPTILAYER™ from Optilayer Ltd., Essential Macleod™ from Thin Film Center Inc., as well as other suitable software tools available on the market.

Returning to FIGS. 1 and 4, the substrate 105 used in the optical elements 100 and 400 may be a substrate suitable for a particular application, and in some embodiments the substrate 105 is configured to transmit light in at least one of the band of wavelengths transmitted by the MLD film(s). In some embodiments, the substrate 105 is configured to transmit both the first and second bands of wavelengths of the dual-band (or multispectral) transmission of the MLD film(s). The choice of material for the substrate 105 may therefore depend on the transmission properties of the MLD film 120. The substrate 105 may be substrates known in the art, including UV fused silica, Pyrex®, Zerodur®, and other optical glasses, such as chalcogenide glass, as well as sapphire, silicon, germanium, etc.

Optical elements 100 and 400 of FIGS. 1 and 4 also include an adhesion layer 130. The adhesion layer 130 functions to bond the DLC coating 110 to the MLD film 120 or 120a. The adhesion layer 130 may be any one of a number of different materials, non-limiting examples of which include germanium, silicon, or an oxide material such as silicon oxide. In some instances the adhesion layer 130 is a metal material. According to some embodiments, the adhesion layer 130 is not necessary, e.g., if the outermost (i.e., away from the substrate 105) layer of the MLD film 120 or 120a also functions as an adhesion layer. For instance, if the outermost layer of the MLD film 120 or 120a is germanium, then a separate adhesion layer 130 is not needed. The thickness of the adhesion layer 130 may be less than 500 nm, and in some embodiments is less than 100 nm. For example, in certain embodiments, the adhesion layer 130 may be about 50 nm in thickness.

Figure 6:
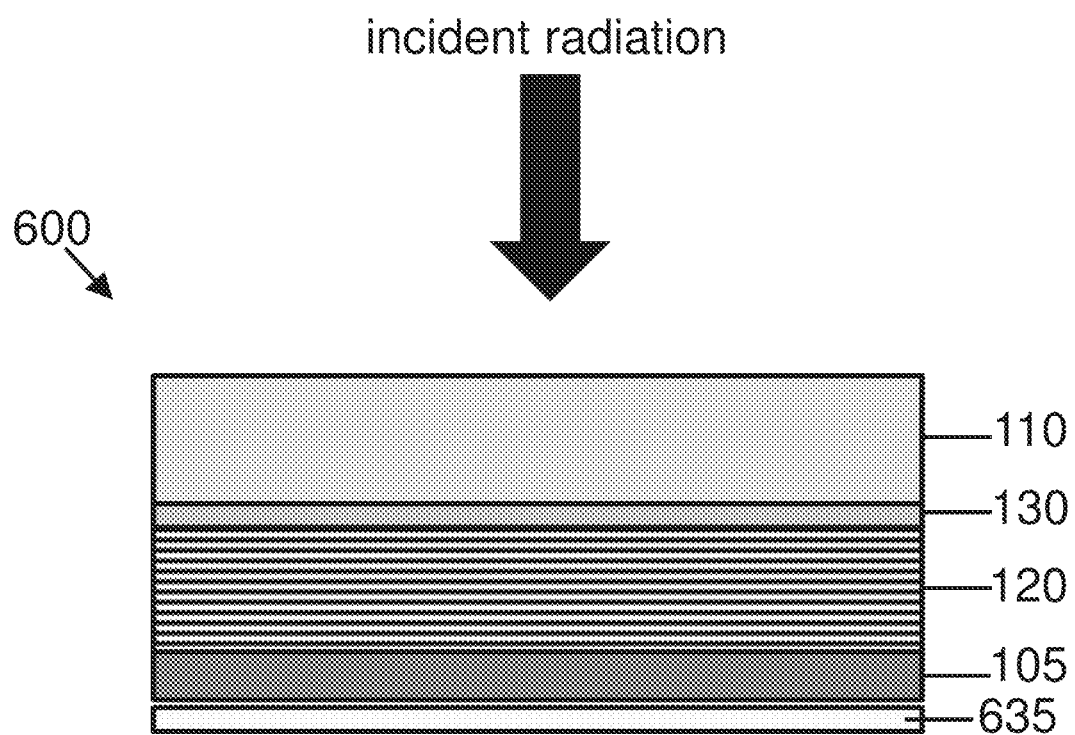
FIG. 6 is a schematic diagram showing another example of an optical element in accordance with one or more aspects of the invention.

Referring now to FIG. 6, an optical element 600 is shown that is similar to the optical element 100 shown in FIG. 1, but includes an antireflective coating (ARC) layer 635 that is disposed on the other, opposite side of the substrate 105 than the MLD film 120. The ARC layer 635 may be any one of a number of different materials, such as oxides and nitrides. Non-limiting examples of ARC materials include silicon oxide, silicon oxygen carbide, titanium oxide, zinc oxide, silicon nitride, titanium nitride, aluminum oxide, etc. Other non-limiting examples of ARC materials include certain fluorides, such as magnesium fluoride ($MgF_2$). The choice of the ARC material may depend on one or more factors, including the wavelength band(s) of interest and the angle of incidence required by the application.

EXAMPLES

The following examples further illustrate the invention and are not intended to limit the scope of the disclosure.

Example 1—DLC Deposition Test

Single layer DLC coatings of varying thicknesses were formed on a silicon disc substrate using different deposition parameters and tested for compressive stress. An RF-PECVD method was used using an apparatus similar to that shown in FIG. 5. The chamber 545 was capacitively coupled with a radio frequency power generator 565 (13.56 MHz) by an impedance matching network and a blocking capacitor. Argon (Ar) and ethylene ($C_2H_4$) were used as the precursor gases. The chamber was pumped down to a base pressure of $2\times10^{-5}$ Torr before deposition. Prior to deposition, the substrates were sputter-cleaned in argon plasma for two minutes, with the argon flow set at 30 sccm and the RF power set at 1500 watts. The depositions were performed at room temperature, with chamber pressure maintained at 0.1 Torr, the RF power at 1600 watts, and the total gas flow at 160 sccm.

RF power, total gas flow, and substrate temperature were all kept constant for each of the depositions. The process parameter that was varied included the percentage of inert gas (argon) in the total gas mixture (i.e., 0%, 16%, and 50%) (or 100% ethylene, 84% ethylene, and 50% ethylene), which affected the gas flow rate, the DC bias voltage, and the deposition rate. Table 1 below indicates the values for the deposition conditions.

TABLE 1

Deposition conditions

| | % of ethylene | | |
|---|---|---|---|
| | 100% | 84% | 50% |
| Ethylene flow rate (sccm) | 160 | 128 | 80 |
| Argon flow rate (sccm) | 0 | 25 | 78 |
| DC bias voltage (V) | 670 | 590 | 455 |
| Deposition rate (nm/sec) | 0.48 | 0.44 | 0.28 |

The DC bias (self-bias) voltage and deposition rate dropped as the ethylene flow rate decreased. This voltage drop is the result of excess ethylene molecule reduction; although the addition of argon was found to both facilitate plasma formation by increasing the plasma density, and to intensify the etching effect. The drop in the deposition rate was the net result of the increasing argon etching effect as the argon content was increased, as well as the lower carbon film forming rate associated with the ethylene reduction.

Figure 7:
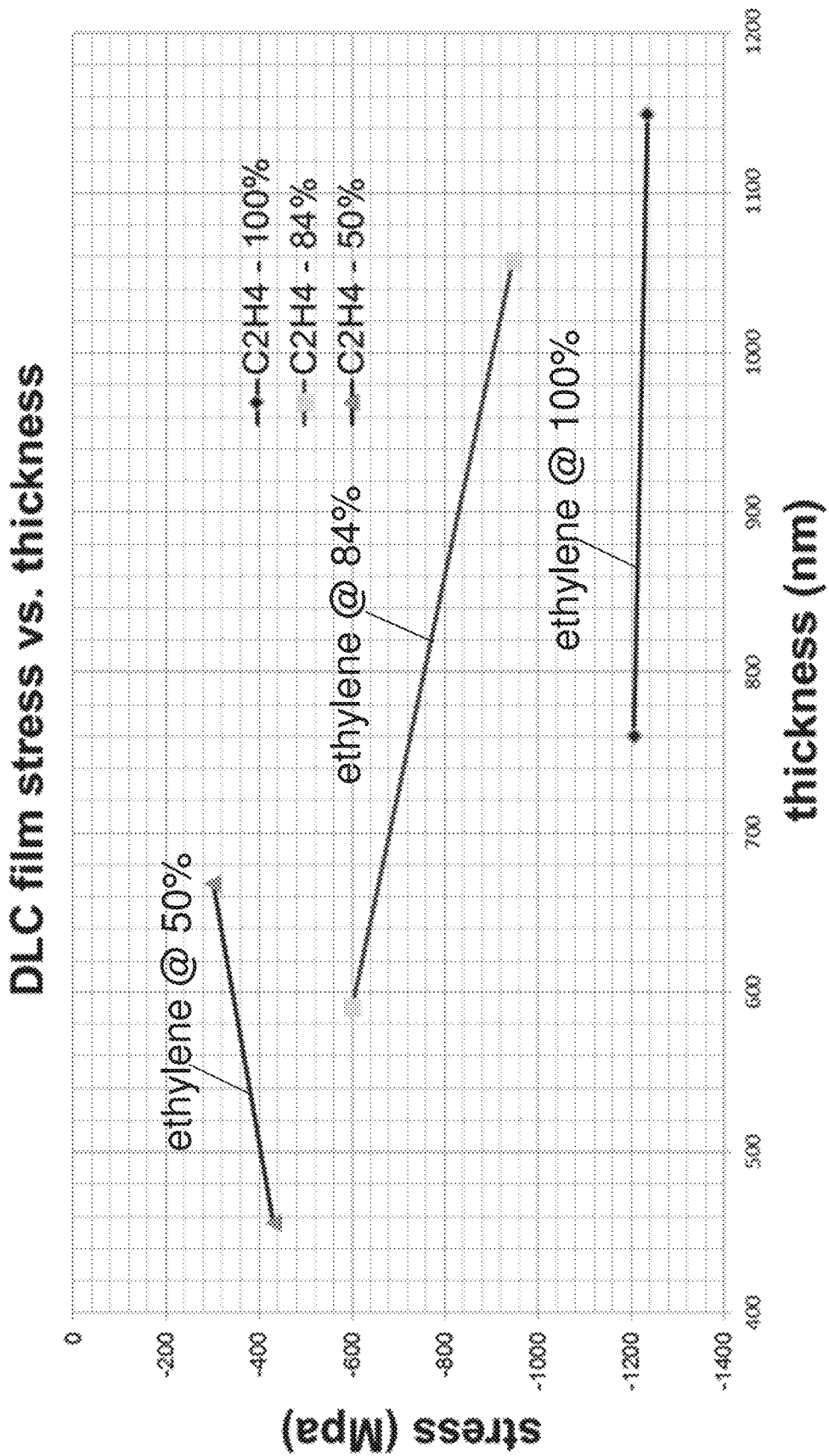
FIG. 7 is a schematic representation of stress versus thickness values for different DLC coatings in accordance with one or more aspects of the invention.

For each gas mixture, two thicknesses that corresponded to deposition times of 25 minutes and 40 minutes were used for stress evaluation, with FIG. 7 plotting the stress versus thickness results for each of the three types of films: (1) ethylene @ 100%, (2) ethylene at 84%, and (3) ethylene at 50%. The Stoney's equation was used to calculate the stress values, and FIG. 7 indicates that compressive stress decreased as the argon content was increased. FIG. 7 also indicates that the stress increases as the thickness increases for the coatings having the highest ethylene content (i.e., 84% and 100%), whereas the stress decreases with thickness for the coating having the lowest ethylene concentration (50%).

Example 2—DLC-Coated Windows $1^{st}$ DLC-Coated Window

An optical element transmissive in the MWIR and LWIR spectral bands and coated with a bilayer DLC coating was constructed using an optical window substrate. Using the optical element 400 shown in FIG. 4 as a reference, the substrate 105 was formed from a one inch diameter, one millimeter thick germanium material. A first MLD film 120a was deposited on a first surface of the germanium substrate, and a second MLD film 120b was deposited on a second surface of the germanium substrate. An adhesion layer 130 consisting of 50 nm of germanium was deposited on the first MLD film 120a, and a DLC layer 110 was disposed on the adhesion layer 130.

The first and second MLD films 120a and 120b were constructed from high, medium, and low index materials, with yttrium fluoride ($YF_3$) being the low index material, zinc sulfide (ZnS) being the medium index material, and germanium (Ge) being the high index material. These materials were input into an optical modeling software program (FILMSTAR™, FTG Software Associates) as well as design criteria that included the desired transmittance bands (MWIR and LWIR). In this instance, each of the first and second MLD films 120a and 120b were configured to transmit both MWIR and LWIR. Each of the first and second MLD films 120a and 120b consisted of 11 repeating stacks of the high index, $1^{st}$ medium index (deposited on the high index), low index (deposited on the $1^{st}$ medium index), and $2^{nd}$ medium index (deposited on the low index) layers with thicknesses as shown in Tables 2 and 3 below. The $2^{nd}$ MLD film also had a layer of low index material (yttrium fluoride) deposited on the $11^{th}$ stack, as indicated in Table 3 below.

The germanium was deposited with an electron beam gun. The yttrium fluoride and the zinc sulfide were deposited via thermal evaporation. A Kaufman type ion beam gun was used for ion-assisted deposition of yttrium fluoride and zinc sulfide layers, which was also used for cleaning the germanium substrate.

TABLE 2

First MLD film (exterior side of window) thicknesses

| | High index (Ge) (nm) | $1^{st}$ medium index (ZnS) (nm) | Low index ($YF_3$) (nm) | $2^{nd}$ medium index (ZnS) (nm) |
|---|---|---|---|---|
| $1^{st}$ stack (deposited on Ge substrate) | 150.00 | 20.00 | 12.88 | 20.00 |
| $2^{nd}$ stack (deposited on first stack) | 152.75 | 20.00 | 76.65 | 20.00 |
| $3^{rd}$ stack (deposited on second stack) | 88.25 | 20.00 | 98.19 | 20.00 |
| $4^{th}$ stack (deposited on third stack) | 101.91 | 20.00 | 143.41 | 20.00 |
| $5^{th}$ stack (deposited on fourth stack) | 66.72 | 20.00 | 189.78 | 20.00 |
| $6^{th}$ stack (deposited on fifth stack) | 40.89 | 20.00 | 1495.57 | 20.00 |
| $7^{th}$ stack (deposited on sixth stack) | 21.09 | 20.00 | 435.61 | 20.00 |
| $8^{th}$ stack (deposited on seventh stack) | 21.49 | 20.00 | 518.05 | 20.00 |
| $9^{th}$ stack (deposited on eighth stack) | 49.63 | 20.00 | 209.14 | 20.00 |
| $10^{th}$ stack (deposited on ninth stack) | 590.65 | 20.00 | 114.9 | 20.00 |
| $11^{th}$ stack (deposited on tenth stack) | 145.92 | 20.00 | 86.88 | 20.00 |

TABLE 3

Second MLD film (interior side of window) thicknesses

| | High index (Ge) (nm) | $1^{st}$ medium index (ZnS) (nm) | Low index ($YF_3$) (nm) | $2^{nd}$ medium index (ZnS) (nm) |
|---|---|---|---|---|
| $1^{st}$ stack (deposited on Ge substrate) | 150.00 | 31.44 | 19.29 | 30.32 |
| $2^{nd}$ stack (deposited on first stack) | 178.60 | 22.25 | 74.73 | 21.88 |
| $3^{rd}$ stack (deposited on second stack) | 30.23 | 15.97 | 101.14 | 15.69 |
| $4^{th}$ stack (deposited on third stack) | 97.26 | 20.00 | 147.17 | 15.00 |

TABLE 3-continued

Second MLD film (interior side of window) thicknesses

| | High index (Ge) (nm) | 1$^{st}$ medium index (ZnS) (nm) | Low index (YF$_3$) (nm) | 2$^{nd}$ medium index (ZnS) (nm) |
|---|---|---|---|---|
| 5$^{th}$ stack (deposited on fourth stack) | 12.79 | 40.38 | 241.12 | 15.92 |
| 6$^{th}$ stack (deposited on fifth stack) | 33.35 | 15.00 | 1403.34 | 15.00 |
| 7$^{th}$ stack (deposited on sixth stack) | 11.84 | 12.96 | 267.81 | 14.32 |
| 8$^{th}$ stack (deposited on seventh stack) | 25.41 | 22.41 | 325.48 | 83.49 |
| 9$^{th}$ stack (deposited on eighth stack) | 76.12 | 42.16 | 178.40 | 42.25 |
| 10$^{th}$ stack (deposited on ninth stack) | 662.88 | 54.32 | 139.64 | 26.57 |
| 11$^{th}$ stack (deposited on tenth stack) | 117.75 | 16.06 | 244.03 | 210.49 |
| Low index (YF$_3$) (deposited on 2$^{nd}$ medium index layer of 11$^{th}$ stack) | | | 537.94 | |

The DLC layer 110 was 500 nm thick and comprised one bilayer, with each of the first layer and second layers of the bilayer having a thickness of 250 nm. The first and second bilayers were deposited at room temperature using an RF-PECVD coating chamber. The first layer of the bilayer was deposited on top of the 50 nm thick germanium adhesion layer 130 with a 50% argon/ethylene plasma mixture, and the second layer of the bilayer was deposited on top of the first layer with an ethylene plasma.

Figure 8:
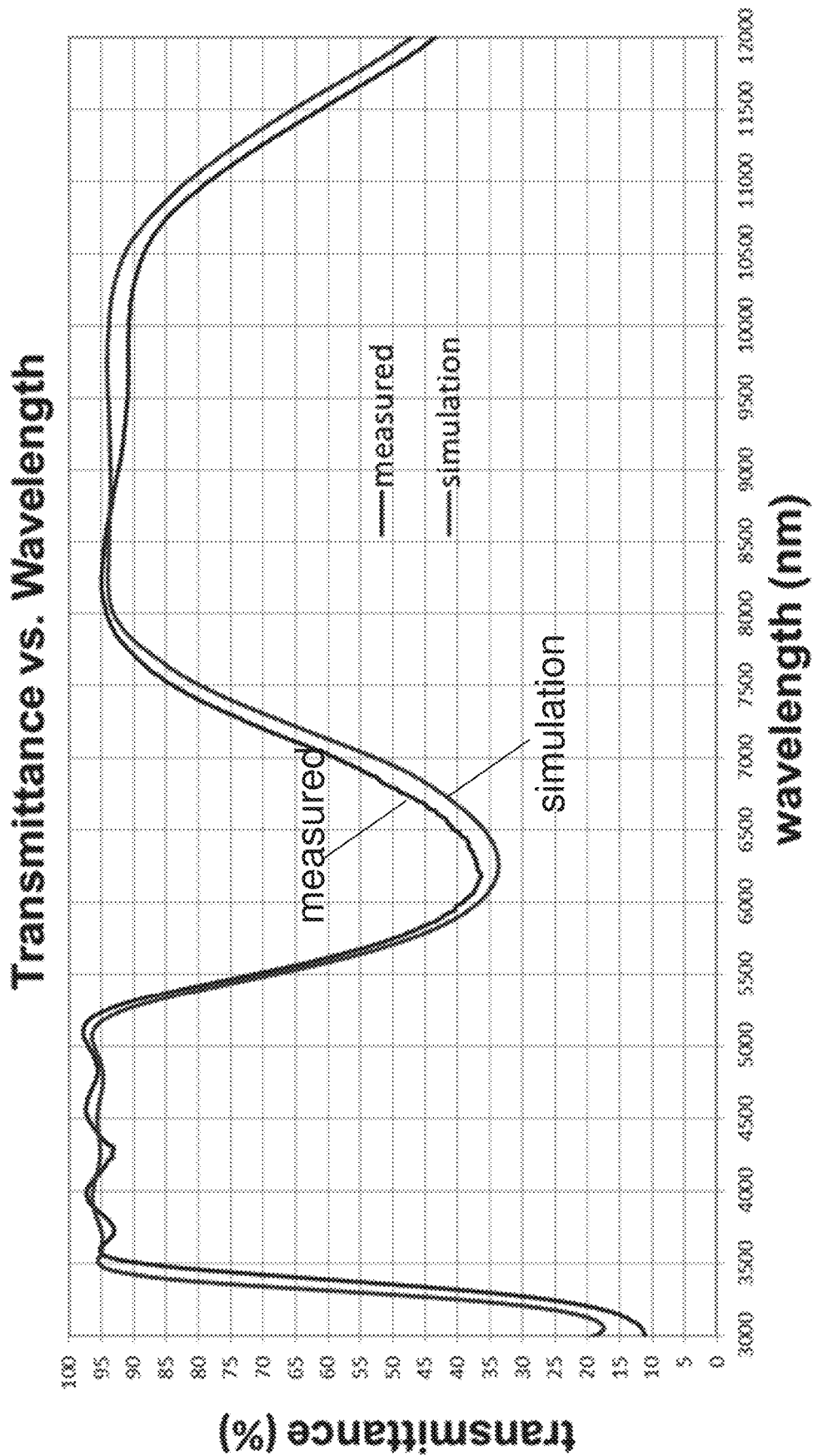
FIG. 8 is a schematic representation of transmission values of an optical element according to one or more aspects of the invention.
Figure 9:
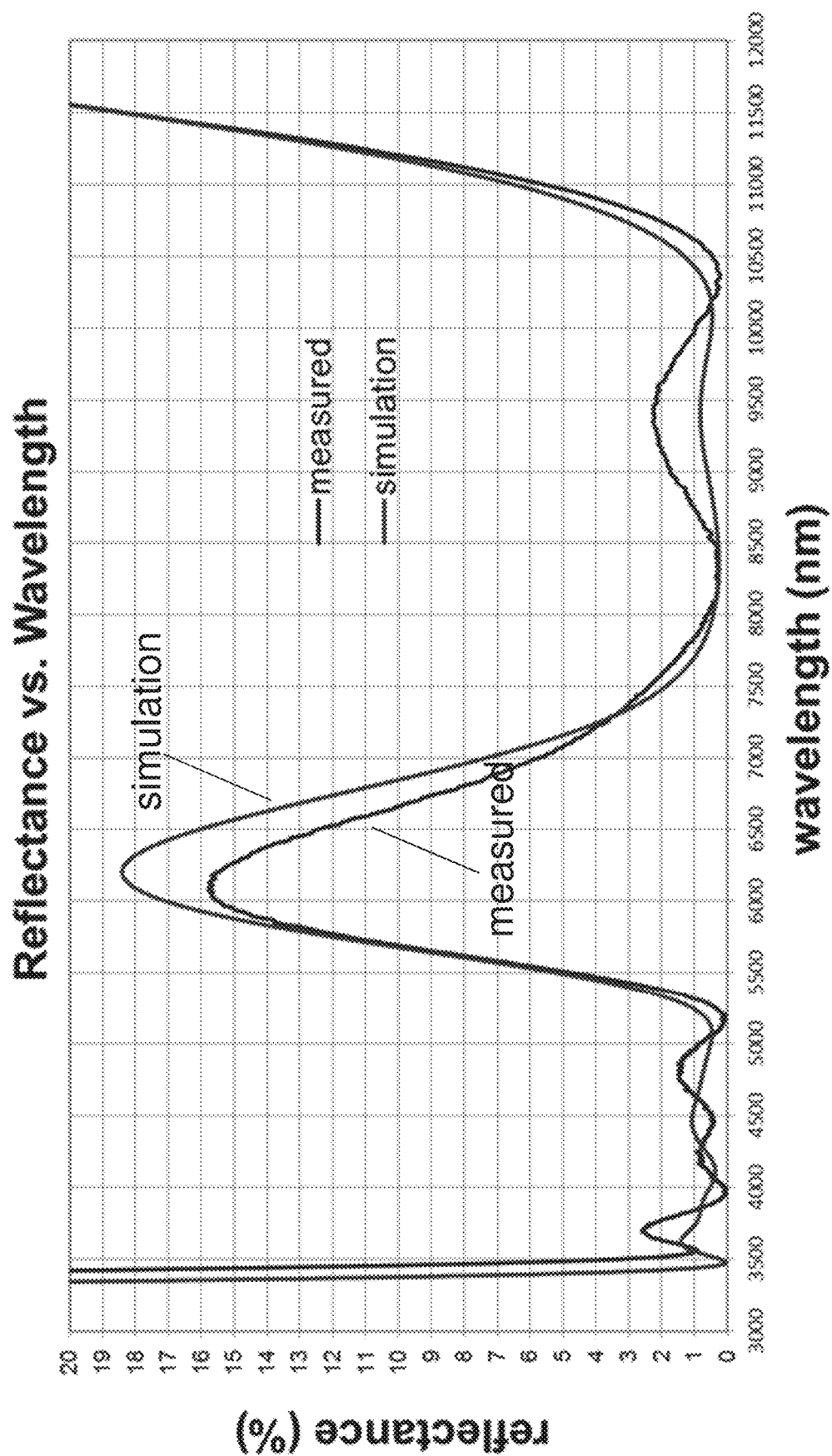
FIG. 9 is a schematic representation of reflection values of the optical element of FIG. 8.

Transmittance and reflectance tests were performed at normal incidence on the sample, with the results shown in FIGS. 8 and 9, respectively. FIG. 8 shows the simulated and real transmittance through the window. The results indicated that the simulation and actual window transmittance values were in good agreement and that the window transmitted about 95% of the light for wavelengths of about 3.5 microns to about 5.0 microns and transmitted at least 90% of light for wavelengths of about 8.0 microns to about 10.5 microns. FIG. 9 shows the simulated and real reflectance values for light reflected from the interior side of the window (reflected from the 2$^{nd}$ MLD film). The simulation and actual window results were in good agreement and indicated that the 2$^{nd}$ MLD film reflected less than about 2% of light having wavelengths of about 3.5 microns to about 5.0 microns and about 8.0 microns to about 10.5 microns, which correlated with the transmittance results.

Durability tests were also performed on the DLC-coated side of the window, and included the following:
 Humidity test, as specified in standard MIL-PRF-13830B, C.4.5.8, with the test modified to extend to 240 hours for 10 days (i.e., 10 times the minimum requirement of 24 hours)
 Salt spray/fog exposure test, as specified in standard MIL-PRF-13830B, C.4.5.9, with the test modified to extend to 120 hours (i.e., 5 times the minimum requirement of 24 hours)
 Severe abrasion test, as specified in standard MIL-PRF-13830B, C.4.5.10, with the test modified to abrade the sample for 200 strokes (i.e., 5 times the minimum requirement of 40 strokes)
 Adhesion test, as specified in standard MIL-PRF-13830B, C.4.5.12
 Temperature test standard MIL-C-48497A, 3.4.2.1

The window passed all of the durability tests.

2$^{nd}$ DLC-Coated Window

A second window identical to the first window described above was constructed, except that the DLC coating of 500 nm thickness included two bilayer stacks, where each of the first and second layers in each of the bilayers was 125 nm in thickness. The DLC-coated side of this sample was subjected to a windscreen wiper test per RSRE Specification TS 1888, Section 5.4.3. The sample passed the test, which included exposing the window to 5000 revolutions of a wiper blade under a 40 gram load using a sand and water slurry mixture.

Having thus described several aspects of at least one example, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

What is claimed is:

1. An optical element comprising:
 a substrate having a first surface and a second surface disposed opposite the first surface;
 a first multi-layer dielectric film disposed on the first surface of the substrate and constructed and arranged to transmit light in a first band of wavelengths, the first multi-layer film including a high index of refraction dielectric layer positioned closest to the first surface of the substrate, a medium index of refraction dielectric layer being an outermost layer away from the first surface of the substrate, and a low index of refraction dielectric layer disposed between the medium index of refraction dielectric layer and the high index of refraction dielectric layer;
 a second multi-layer dielectric film disposed on the second surface of the substrate and constructed and arranged to transmit light in a second band of wavelengths, the first and the second bands of wavelengths at least partially overlapping; and
 a bilayer diamond-like carbon (DLC) coating disposed on the first multi-layer dielectric film, the bilayer DLC coating including a first layer and a second layer, the first layer having a modulus of elasticity of a first value, and the second layer disposed on the first layer and having a modulus of elasticity of a second value that is greater than the first value.

2. The optical element of claim 1, further comprising an adhesion layer disposed between the first multi-layer dielectric film and the bilayer DLC coating.

3. The optical element of claim 2, wherein the adhesion layer is one of silicon, germanium, and an oxide.

4. The optical element of claim 2, wherein at least one of the first multi-layer dielectric film and the second multi-layer dielectric film comprises one or more stacks of:
 a first high index of refraction dielectric layer;
 a first medium index of refraction dielectric layer disposed over and contacting the first high index of refraction layer;
 a first low index of refraction dielectric layer disposed over and contacting the first medium index of refraction layer; and a second medium dielectric index of refraction layer disposed over and contacting the first low index of refraction layer, wherein the first high index of refraction dielectric layer has an index of refraction that is greater than the first medium index of refraction dielectric layer, the second medium index of refraction dielectric layer, and the first low index of refraction dielectric layer, and the indices of refraction of the first and second medium index of refraction dielectric layers are greater than the index of refraction of the first low index of refraction dielectric layer.

5. The optical element of claim 1, wherein the bilayer DLC coating is a first bilayer DLC coating and the optical element further comprises a second bilayer DLC coating disposed on the first bilayer DLC coating.

6. The optical element of claim 5, further comprising at least one additional bilayer DLC coating disposed on the second bilayer DLC coating.

7. The optical element of claim 1, wherein the first and second bands of wavelengths are configured to transmit visible (VIS) light having wavelengths of from 0.4 to 0.75 microns and at least one of near-infrared (NIR) light having wavelengths of from 0.75 to 1.4 microns, short-wavelength infrared (SWIR) light having wavelengths of approximately 1.4-3 microns, mid-wavelength infrared (MWIR) light having wavelengths of approximately 3-8 microns, long-wavelength infrared (LWIR) light having wavelengths of approximately 8-15 microns, and far-infrared (FIR) light having wavelengths of approximately 15-1000 microns.

8. The optical element of claim 7, wherein the substrate is configured to transmit VIS and the at least one of NIR, SWIR, MWIR, LWIR, and FIR light.

9. The optical element of claim 1, wherein the first and second bands of wavelengths are configured to transmit mid-wavelength infrared (MWIR) light having wavelengths of from 3 to 8 microns and long-wavelength infrared (LWIR) light having wavelengths of from 8 to 15 microns.

10. The optical element of claim 9, wherein the substrate is configured to transmit MWIR and LWIR light.

11. The optical element of claim 1, wherein the first layer of the DLC coating has an sp3/sp2 ratio with a first value, and the second layer of the DLC coating has an sp3/sp2 ratio with a second value that is higher than the first value.

12. The optical element of claim 1, wherein the second layer of the DLC coating consists of sp3 bonded carbon.

13. The optical element of claim 1, wherein the first layer of the DLC coating comprises a mixture of sp3 and sp2 bonded carbon.

14. The optical element of claim 1, wherein the bilayer DLC coating has a thickness of at least 500 nm.

15. A method of forming an optical element comprising:
providing a substrate having a first surface and a second surface disposed opposite the first surface;
depositing a first multi-layer dielectric film on the first surface of the substrate such that the first multi-layer dielectric film transmits light having a first band of wavelengths, the first multi-layer film including a high index of refraction dielectric layer positioned closest to the first surface, a medium index of refraction dielectric layer being an outermost layer of the first multi-layer dielectric film away from the substrate, and a low index of refraction dielectric layer arranged between the medium index of refraction dielectric layer and the high index of refraction dielectric layer;
depositing a second multi-layer dielectric film on the second surface of the substrate such that the second multi-layer dielectric film transmits light having a second band of wavelengths, the first and the second bands of wavelengths at least partially overlapping;
forming a first layer of a DLC coating on the first multi-layer dielectric film having a modulus of elasticity of a first value; and
forming a second layer of DLC coating on the first layer of DLC coating having a modulus of elasticity of a second value that is greater than the first value.

16. The method of claim 15, wherein forming the first and the second layers of the DLC coating includes plasma enhanced chemical vapor deposition (PECVD).

17. The method of claim 16, wherein PECVD for the second layer of the DLC coating includes a plasma consisting of a hydrocarbon.

18. The method of claim 16, wherein PECVD for the first layer of the DLC coating includes a plasma consisting of a mixture of a hydrocarbon and an inert gas.

19. The method of claim 18, wherein the mixture is at least 50% inert gas.

20. The method of claim 15, wherein the first and the second bands of wavelengths are configured to transmit visible (VIS) light having wavelengths of from 0.4 to 0.75 microns and at least one of near-infrared (NIR) light having wavelengths of from 0.75 to 1.4 microns, short-wavelength infrared (SWIR) light having wavelengths of approximately 1.4-3 microns, mid-wavelength infrared (MWIR) light having wavelengths of approximately 3-8 microns, long-wavelength infrared (LWIR) light having wavelengths of approximately 8-15 microns, and far-infrared (FIR) light having wavelengths of approximately 15-1000 microns.

* * * * *